United States Patent [19]

Yamanaka

[11] Patent Number: 6,065,149
[45] Date of Patent: May 16, 2000

[54] ERROR CORRECTION DEVICE FOR A COMMUNICATION SYSTEM

[75] Inventor: Ryutaro Yamanaka, Kanagawa, Japan

[73] Assignee: Matsushita Electric Industrial Co., Ltd., Osaka, Japan

[21] Appl. No.: 08/975,542

[22] Filed: Nov. 20, 1997

[30] Foreign Application Priority Data

Nov. 21, 1996 [JP] Japan ................................. 8-311021

[51] Int. Cl.$^7$ ................................................ H03M 13/00
[52] U.S. Cl. ..................... 714/780; 714/758; 714/784; 714/795
[58] Field of Search ....................... 714/758, 780, 714/784, 795

[56] References Cited

U.S. PATENT DOCUMENTS

| 5,457,704 | 10/1995 | Hoeher et al. | 714/786 |
| 5,537,444 | 7/1996 | Nill et al. | 375/341 |
| 5,857,044 | 1/1999 | Ogawa et al. | 386/62 |
| 5,875,199 | 2/1999 | Luthi | 371/37.06 |

FOREIGN PATENT DOCUMENTS

| 6-205054 | 7/1994 | Japan . |
| 7-22968 | 1/1995 | Japan . |
| 8-251144 | 9/1996 | Japan . |

*Primary Examiner*—Emmanuel L. Moise
*Assistant Examiner*—Esaw Abraham
*Attorney, Agent, or Firm*—Pearne, Gordon, McCoy & Granger LLP

[57] ABSTRACT

The error correction device is provided with an internal code decoder which outputs a series of decoded data and reliability information of the decoded data, a CRC (Cyclic Redundancy Check) decoder, a de-interleaver, an erasure position detector, and an external code decoder for decoding an external code by soft judgement. When the external code is decoded by the soft judgment, not only the series of decoded data of the internal code and their reliability information but also frame error information based on CRC are used as input signals. It is therefore possible to perform error correction with a high accuracy and to obtain low BER characteristics.

4 Claims, 4 Drawing Sheets

FIG. 3

POSITIONS OF CANDIDATES OF ERASURE POSITIONS BASED ON CRC
: 37, 35, 32, 30, 27, 25, 22, 20, 17, 15, 12, 10, 7, 5, 2, 0
(WHEN 2 OF 5 FRAMES ARE IN ERROR)

INTERFRAME INTERLEAVE
FOR EVERY 5 FRAMES

POSITION OF SYMBOL  39 38 37 36 35 34 33 32 31 30 29 28 27 26 25 24 23 22 21 20

DATA

RELIABILITY 19 18 17 16 15 14 13 12 11 10 9 8 7 6 5 4 3 2 1 0

UPPER 8 BITS

LOWER 8 BITS

SORTED IN ASCEDING ORDER OF THE RELIABILITY

LOWER ← RELIABILITY → HIGHER
5, 22, 37, 11, 7, 19, 12, 28, 32, 3, 17, 2, 25, 36, 29, 4, 18, 33, 24, 39, 16, ···

16 CANDIDATES REGARDED AS
ERASURE POSITIONS BASED ON CRC:
37, 35, 32, 30, 27, 25, 22, 20, 17, 15, 12, 10, 7, 5, 2, 0

ERASURE POSITIONS BASED ON BOTH THE CRC JUDGEMENT RESULT
AND THE RELIABILITY OF THE OUTPUTTED DATA: 5, 22, 37, 7, 12, 32, 17, 2

ERROR CORRECTION DEVICE FOR A COMMUNICATION SYSTEM

BACKGROUND OF THE INVENTION

The present invention relates to an error correction device suitable for a communication system using a concatenated code.

The Unexamined Japanese Patent Application Publication No. Hei 7-22968 discloses a conventional communication system using a concatenated code and constituted by an outside encoder 11 and an inside encoder 12 which are provided on the transmission side, and an inside decoder 13 and an outside decoder 14 which are provided on the reception side, as shown in FIG. 8. Viterbi algorithm using maximum-likehood decoding is applied to decoding of an internal code to calculate the reliability of a series of decoded data. As the means for calculating the reliability of a series of decoded data, SOVA (Soft Output Viterbi Algorithm) is used for obtaining reliability information for every symbol as shown in FIG. 9, as disclosed in the Unexamined Japanese Patent Application Publication No. Hei 8-251144. On the other hand, as an example of the external code, a Reed Solomon code is used as disclosed in the Unexamined Japanese Patent Application Publication No. Hei 6-205054.

In non-speech communication such as data transmission, etc., high transmission quality with a lower bit error ratio (thereinafter abbreviated to "BER") is required in comparison with speech communication. In addition, in mobile radio communication or the like, it is desired to keep up the life of a battery of a portable terminal for a long time, and it is therefore required to reduce the output of transmission to thereby reduce the power consumption. If the BER can be made lower, a required Eb/Io can be designed to be smaller so that transmission can be performed with a lower output to thereby reduce the power consumption of the portable terminal.

However, conventional communication devices using a concatenated code were designed to attain less delay rather than low BER because they were directed mainly to be used for speech communication. Therefore, there was a problem that they cannot be regarded as optimum systems for non-speech communication. Because of the problem, it was inevitable to increase the transmission power, and if the transmission power was increased, there occurred another problem that the increased transmission power caused interference with transmission signals from other terminals.

In addition, when a concatenated code was used, maximum-likehood decoding based on Viterbi algorithm was performed for decoding an internal code, and the reliability of a series of decoded data was obtained from maximum-likehood information. Therefore, when an external code was intended to be decoded by soft judgement, the soft judgement decoding could not help using only the series of decoded data of the internal code and the maximum-likehood information thereof as input signals, so that there was a problem that error correction could not be attained with a high accuracy.

SUMMARY OF THE INVENTION

The present invention is intended to solve such conventional problems, and it is an object thereof to provide an error correction device which can improve the capability of error correction and realize low BER.

In order to attain the foregoing object, according to the present invention, the error correction device is provided with an internal code decoder which outputs a series of decoded data and reliability information of the decoded data, a CRC (Cyclic Redundancy Check) decoder for performing CRC judgement, an de-interleaver for performing de-interleave, a erasure position detector for performing an erasure position detecting process, and an external code decoder for decoding an external code by soft judgement. With such a structure, when the external code is decoded by the soft judgment, not only the series of decoded data of the internal code and their reliability information but also frame error information based on CRC are used as input signals. It is therefore possible to perform error correction with a high accuracy and to obtain low BER characteristics.

According to a first aspect of the invention, there is provided an error correction device comprising: an internal code decoder for receiving reception data, and performing a decoding process of an internal code and calculation of reliability thereof; a CRC (Cyclic Redundancy Check) decoder for receiving an output of the internal code decoder, and performing a CRC process; a de-interleaver for receiving an output of the CRC decoder, and performing de-interleave; an erasure position detector for receiving the output of the CRC decoder and an output of the de-interleaver, and performing an erasure position detecting process; and an external code decoder for receiving an output of the erasure position detector, and decoding an external code by soft judgement. Accordingly, the device has an effect that it is possible to perform error correction with a high accuracy and to obtain low BER characteristics.

According to a second aspect of the invention, there is provided an error correction device according to a first aspect, further comprising an electric field intensity meter for measuring electric field intensity of the reception data and inputting the measured electric field intensity to the internal code decoder when the internal code is to be decoded, wherein a Reed Solomon code is used as the external code. Accordingly, the device has an effect that it is possible to perform error correction with a higher accuracy and to obtain low BER characteristics.

According to a third aspect of the invention, there is provided an error correction device according to a first aspect, further comprising an SIR meter for measuring SIR (Signal Interface Ratio) and inputting the measured SIR to the internal code decoder when the internal code is to be decoded, wherein a Reed Solomon code is used as the external code. Accordingly, the device has an effect that it is possible to perform error correction with a higher accuracy and to obtain low BER characteristics.

According to a fourth aspect of the invention, there is provided an error correction device according to a first aspect, wherein SOVA (Soft Output Viterbi Algorithm) is applied to decoding algorithm of the internal code, and a Reed Solomon code is used as the external code. Accordingly, the device has an effect that it is possible to perform error correction with a much higher accuracy and to obtain low BER characteristics.

BRIEF DESCRIPTION OF THE DRAWINGS

FIG. 3 is a model diagram showing erasure position judgement by using both CRC and reliability of decoded data.

DETAILED DESCRIPTION OF THE PREFERRED EMBODIMENTS

Embodiment 1

Figure 1:
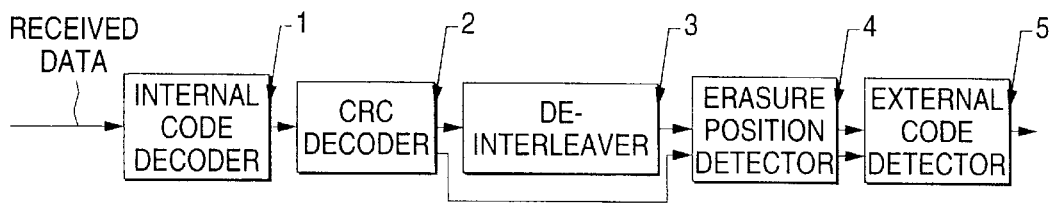
FIG. 1 is a block diagram illustrating the configuration of an error correction device in Embodiment 1 according to the present invention.

An embodiment of the present invention will be described below with reference to FIGS. 1 to 7. FIG. 1 shows the configuration of an error correction device in Embodiment 1 corresponding to a first aspect of the present invention. In FIG. 1, the reference numeral 1 represents an internal code decoder for receiving reception data, performing a decoding process of an internal code, and calculating the reliability of the decoded data; 2, a CRC decoder for receiving the decoded data and the reliability of the decoded data as the output of the internal code decoder 1 and performing a CRC process; 3, a de-interleaver for receiving the output data from the CRC decoder 2 and the reliability of the output data, and performing de-interleave; 4, an erasure position detector for receiving the CRC judgement result of the CRC decoder 2, the output data from the de-interleaver 3 and the reliability of the output data, and performing an erasure position detecting process; and 5, an external code decoder for receiving the detection result and output data of the erasure position detector 4, and performing a process of a decoding Reed Solomon code. The output of the internal code decoder 1 is inputted to the CRC decoder 2. One of the outputs of the CRC decoder 2 is inputted to the de-interleaver 3, and the other output of the CRC decoder 2 is inputted to the erasure position detector 4. The output of the de-interleaver 3 is inputted to the erasure position detector 4, and the output of the erasure position detector 4 is inputted to the external code decoder 5.

Figure 2:
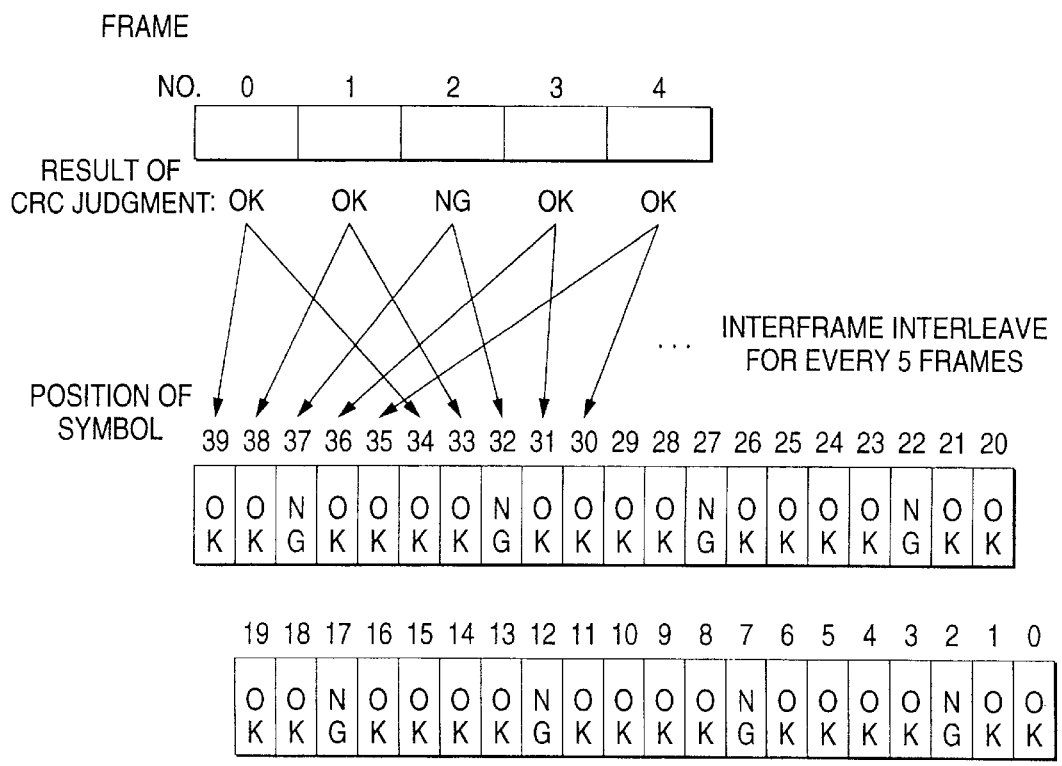
FIG. 2 is a model diagram showing the result of CRC judgement by means of a CRC decoder.

Next, the operation in this embodiment will be described with reference to FIGS. 2 and 3. In the following description, it is assumed that the interleave length is 5 frames, and interframe interleave is performed for every 5 frames. In addition, a Reed Solomon code is used as an external code. As a format of the code, a compacted code RS (40, 32, 4) based on an original RS (255, 247, 4) code defined on Galois field ($2^8$) is used, and 8-symbol erasure correction and 4-symbol error correction are performed separately in the external code decoder 5. Switching between the 8-symbol erasure correction and the 4-symbol error correction is decided by the erasure position detector 4, thereby controlling the external code decoder 5. In addition, at the time of the 8-symbols erasure correction, the erasure positions of 8 symbols are also inputted to the external code decoder 5. In this embodiment, one symbol in the Reed Solomon code is constituted by 8 bits.

In the CRC decoder 2, frame error detection is performed on the basis of CRC judgement. In the case of interframe interleave for every 5 frames, when a frame error is detected in one frame of five frames, it is understood that one symbol is erased for every 5 symbols in 40 symbols of received words inputted in the decoding process of the Reed Solomon code. However, in fact, one symbol is not always erased for every 5 symbols, but at least one symbol is erased. Therefore, when a frame error is detected by CRC judgement by the CRC decoder 2 in one frame of 5 frames in which interframe de-interleave will be performed, the detected information is inputted to the erasure position detector 4. The erasure position detector 4 determines that 8 symbols have been erased in the 40 symbols, controls the external code decoder 5 so as to correct the erasure of the 8 symbols, and further inputs the erasure positions of the 8 symbols to the external code decoder 5. The external code decoder 5 corrects the erasure of the 8 symbols.

On the other hand, when no frame error is detected by the CRC judgement of the CRC decoder 2, the erasure position detector 4 receives the information, and controls the external code decoder 5 so as to perform 4-symbol error correction in order to prevent residual errors. Alternatively, when a frame error of two or more frames is detected by the CRC judgement of the CRC decoder 2, 16 or more candidates are regarded as erasure positions, as shown in FIG. 3. At this time, the erasure position detector 4 cannot limit the erasure positions to 8 positions, and therefore decides the erasure positions also by means of both the CRC judgement result and the reliability of output data. That is, as shown in FIG. 3, 8 positions of the candidates of erasure positions based on the CRC judgement result are searched in ascending order of the reliability of decoded data obtained by the internal code decoder 1, and 8-symbol erasure correction is performed by being regarded the searched positions as the erasure positions. Then, the internal code decoder 1 calculates reliability of 8 bits for every one symbol constituted by 8 bits, and outputs decoded data of 8 bits and the reliability of 8 bits alternately.

In the CRC decoder 2, of the inputted decoded data and the inputted reliability of the decoded data, only the decoded data is subjected to CRC judgement process. The output data and the reliability of the output data inputted to the de-interleaver 3 are temporarily stored in a buffer. In the buffer, the decoded data are stored in the upper 8 bits of one word (16 bits), and the reliability is stored in the lower 8 bits. The de-interleaver 3 performs a de-interleave process by word. With the above-mentioned configuration and operation, it is possible to perform an error correction process with a high accuracy.

Embodiment 2

Figure 4:
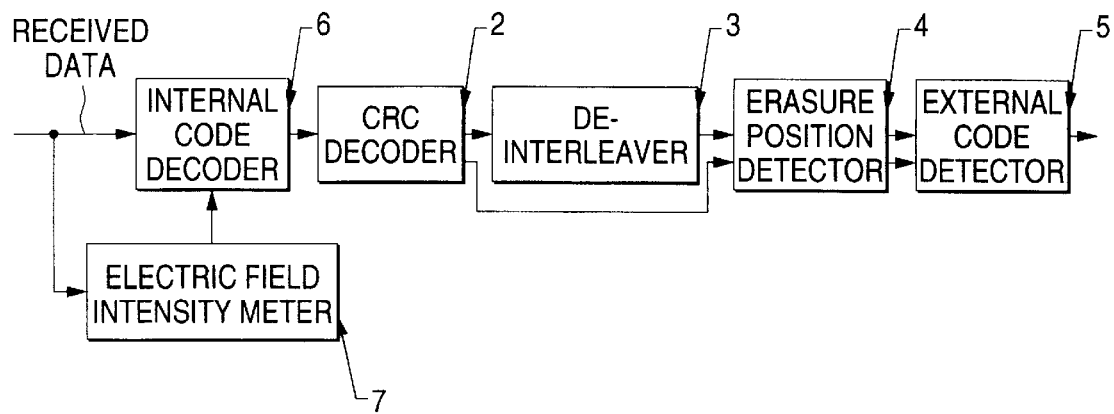
FIG. 4 is a block diagram illustrating the configuration of an error correction device in Embodiment 2 according to the present invention.

FIG. 4 shows the configuration of an error correction device in Embodiment 2 corresponding to a second aspect of the present invention. In FIG. 4, the reference numeral 6 represents an internal code decoder for receiving reception data, performing a decoding process of an internal code, and calculating the reliability of the decoded data; 2, a CRC decoder for receiving the decoded data and the reliability of the decoded data as the output of the internal code decoder 6 and performing a CRC process; 3, a de-interleaver for receiving the output data from the CRC decoder 2 and the reliability of the output data, and performing de-interleave; 4, an erasure position detector for receiving the CRC judgement result of the CRC decoder 2, the output data from the de-interleaver 3 and the reliability of the output data, and performing an erasure position detecting process; 5, an external code decoder for receiving the detection result and output data of the erasure position detector 4, and performing a process of decoding a Reed Solomon code; and 7, an electric field intensity meter for measuring the electric field intensity on the basis of the reception data.

The output of the internal code decoder 6 is inputted to the CRC decoder 2. One of the outputs of the CRC decoder 2 is inputted to the de-interleaver 3, and the other output of the CRC decoder 2 is inputted to the erasure position detector 4. The output of the de-interleaver 3 is inputted to the erasure position detector 4, and the output of the erasure position detector 4 is inputted to the external code decoder 5. The output of the electric field intensity meter is inputted to the internal code decoder 6.

Next, the operation in this embodiment will be described with reference to FIGS. 2 and 3. In the following description, it is assumed that the interleave length is 5 frames, and interframe interleave is performed for every 5 frames. In addition, a Reed Solomon code is used as an external code. As a format of the code, a compacted code RS (40, 32, 4) based on an original RS (255, 247, 4) code defined on Galois field ($2^8$) is used, and 8-symbol erasure correction and 4-symbol error correction are performed separately in the external code decoder 5. Switching between the 8-symbol erasure correction and the 4-symbol error correction is decided by the erasure position detector 4, thereby controlling the external code decoder 5. In addition, at the time of the 8-symbols erasure correction, the erasure positions of 8 symbols are also inputted to the external code decoder 5. In this embodiment, one symbol in the Reed Solomon code is constituted by 8 bits.

In the CRC decoder 2, frame error detection is performed on the basis of CRC judgement. In the case of interframe interleave for every 5 frames, when a frame error is detected in one frame of five frames, it is understood that one symbol is erased for every 5 symbols in 40 symbols of received words inputted in the decoding process of the Reed Solomon code. However, in fact, one symbol is not always erased for every 5 symbols, but at least one symbol is erased. Therefore, when a frame error is detected by CRC judgement by the CRC decoder 2 in one frame of 5 frames in which interframe de-interleave will be performed, the detected information is inputted to the erasure position detector 4. The erasure position detector 4 determines that 8 symbols have been erased in the 40 symbols, controls the external code decoder 5 so as to correct the erasure of the 8 symbols, and further inputs the erasure positions of the 8 symbols to the external code decoder 5. The external code decoder 5 corrects the erasure of the 8 symbols.

On the other hand, when no frame error is detected by the CRC judgement of the CRC decoder 2, the erasure position detector 4 receives the information, and controls the external code decoder 5 so as to perform 4-symbol error correction in order to prevent residual errors. Alternatively, when a frame error of two or more frames is detected by the CRC judgement of the CRC decoder 2, 16 or more candidates are regarded as erasure positions, as shown in FIG. 3. At this time, the erasure position detector 4 cannot limit the erasure positions to 8 positions, and therefore decides the erasure positions also by means of both the CRC judgement result and the reliability of output data. That is, as shown in FIG. 3, 8 positions of the candidates of erasure positions based on the CRC judgement result are searched in ascending order of the reliability of decoded data obtained by the internal code decoder 6, and 8-symbol erasure correction is performed by being regarded the searched positions as the erasure positions.

The electric field intensity measured by the electric field intensity meter 7 is used as the reliability of decoded data.

The electric field intensity meter 7 receives reception data, measures the electric field intensity of the reception data, and inputs the measurement result to the internal code decoder 6, as shown in FIG. 4. The internal code decoder 6 converts the inputted electric field intensity of the reception data into the reliability of 8 bits, and outputs the decoded data of 8 bits and the reliability of 8 bits alternately.

In the CRC decoder 2, of the inputted decoded data and the inputted reliability of the decoded data, only the decoded data is subjected to CRC judgement process. The output data and the reliability of the output data inputted to the de-interleaver 3 are temporarily stored in a buffer. In the buffer, the decoded data are stored in the upper 8 bits of one word (16 bits), and the reliability is stored in the lower 8 bits. The de-interleaver 3 performs a de-interleave process by word. With the above-mentioned configuration and operation, it is possible to perform an error correction process with a much higher accuracy.

Embodiment 3

Figure 5:
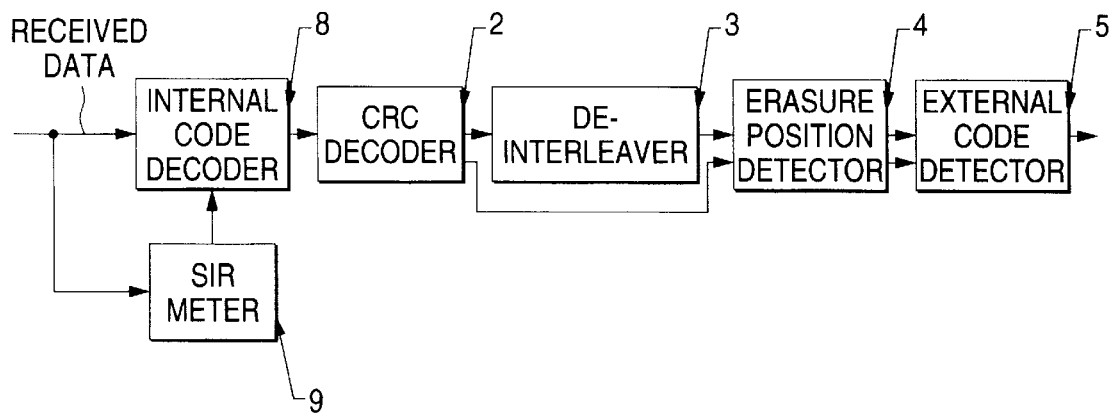
FIG. 5 is a block diagram illustrating the configuration of an error correction device in Embodiment 3 according to the present invention.

FIG. 5 shows the configuration of an error correction device in Embodiment 3 corresponding to a third aspect of the present invention. In FIG. 5, the reference numeral 8 represents an internal code decoder for receiving reception data, performing a decoding process of an internal code, and calculating the reliability of the decoded data; 2, a CRC decoder for receiving the decoded data and the reliability of the decoded data as the output of the internal code decoder 8 and performing a CRC process; 3, a de-interleaver for receiving the output data from the CRC decoder 2 and the reliability of the output data, and performing de-interleave; 4, an erasure position detector for receiving the CRC judgement result of the CRC decoder 2, the output data from the de-interleaver 3 and the reliability of the output data, and performing an erasure position detecting process; 5, an external code decoder for receiving the detection result and output data of the erasure position detector 4, and performing a process of decoding a Reed Solomon code; and 9, an SIR meter for measuring SIR on the basis of the reception data.

The output of the internal code decoder 8 is inputted to the CRC decoder 2. One of the outputs of the CRC decoder 2 is inputted to the de-interleaver 3, and the other output of the CRC decoder 2 is inputted to the erasure position detector 4. The output of the de-interleaver 3 is inputted to the erasure position detector 4, and the output of the erasure position detector 4 is inputted to the external code decoder 5. The output of the SIR meter 9 is inputted to the internal code decoder 8.

Next, the operation in this embodiment will be described with reference to FIGS. 2 and 3. In the following description, it is assumed that the interleave length is 5 frames, and interframe interleave is performed for every 5 frames. In addition, a Reed Solomon code is used as an external code. As a format of the code, a compacted code RS (40, 32, 4) based on an original RS (255, 247, 4) code defined on Galois field ($2^8$) is used, and 8-symbol erasure correction and 4-symbol error correction are performed separately in the external code decoder 5. Switching between the 8-symbol erasure correction and the 4-symbol error correction is decided by the erasure position detector 4, thereby controlling the external code decoder 5. In addition, at the time of the 8-symbols erasure correction, the erasure positions of 8 symbols are also inputted to the external code decoder 5. In this embodiment, one symbol in the Reed Solomon code is constituted by 8 bits.

In the CRC decoder 2, frame error detection is performed on the basis of CRC judgement. In the case of interframe interleave for every 5 frames, when a frame error is detected in one frame of five frames, it is understood that one symbol is erased for every 5 symbols in 40 symbols of received words inputted in the decoding process of the Reed Solomon code. However, in fact, one symbol is not always erased for every 5 symbols, but at least one symbol is erased. Therefore, when a frame error is detected by CRC judgement by the CRC decoder 2 in one frame of 5 frames in which interframe de-interleave will be performed, the detected information is inputted to the erasure position detector 4. The erasure position detector 4 determines that 8 symbols have been erased in the 40 symbols, controls the external code decoder 5 so as to correct the erasure of the 8 symbols, and further inputs the erasure positions of the 8 symbols to the external code decoder 5. The external code decoder 5 corrects the erasure of the 8 symbols.

On the other hand, when no frame error is detected by the CRC judgement of the CRC decoder 2, the erasure position detector 4 receives the information, and controls the external code decoder 5 so as to perform 4-symbol error correction in order to prevent residual errors. Alternatively, when a frame error of two or more frames is detected by the CRC judgement of the CRC decoder 2, 16 or more candidates are regarded as erasure positions, as shown in FIG. 3. At this time, the erasure position detector 4 cannot limit the erasure positions to 8 positions, and therefore decides the erasure positions also by means of both the CRC judgement result and the reliability of output data. That is, as shown in FIG. 3, 8 positions of the candidates of erasure positions based on the CRC judgement result are searched in ascending order of the reliability of decoded data obtained by the internal code decoder 8, and 8-symbol erasure correction is performed by being regarded the searched positions as the erasure positions.

Here, SIR measured by the SIR meter 9 is used as the reliability of the decoded data. The SIR meter 9 receives the reception data, measures the SIR of the reception data, and inputs the measurement result to the internal code decoder 8, as shown in FIG. 5. The internal code decoder 8 converts the inputted SIR of the reception data into the reliability of 8 bits, and outputs the decoded data of 8 bits and the reliability of 8 bits alternately.

In the CRC decoder 2, of the inputted decoded data and the inputted reliability of the decoded data, only the decoded data is subjected to CRC judgement process. The output data and the reliability of the output data inputted to the de-interleaver 3 are temporarily stored in a buffer. In the buffer, the decoded data are stored in the upper 8 bits of one word (16 bits), and the reliability is stored in the lower 8 bits. The de-interleaver 3 performs a de-interleave process by word. With the above-mentioned configuration and operation, it is possible to perform an error correction process with a higher accuracy.

Embodiment 4

Figure 6:
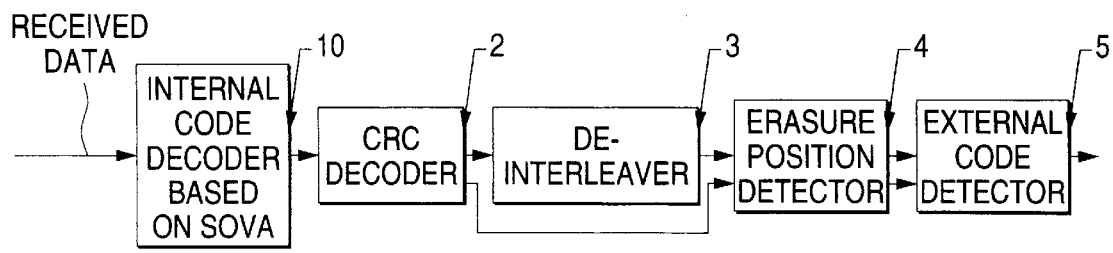
FIG. 6 is a block diagram illustrating the configuration of an error correction device in Embodiment 4 according to the present invention.

FIG. 6 shows the configuration of an error correction device in Embodiment 4 corresponding to a fourth aspect of the present invention. In FIG. 6, the reference numeral 10 represents an internal code decoder for receiving reception data, performing a decoding process of an internal code on the basis of SOVA, and calculating the reliability of the decoded data; 2, a CRC decoder for receiving the decoded data which is the output of the internal code decoder 10 based on SOVA and the reliability of the decoded data, and performing a CRC process; 3, a de-interleaver for receiving the output data from the CRC decoder 2 and the reliability of the output data, and performing de-interleave; 4, an erasure position detector for receiving the CRC judgement result of the CRC decoder 2, the output data from the de-interleaver 3 and the reliability of the output data, and performing an erasure position detecting process; and 5, an external code decoder for receiving the detection result and output data of the erasure position detector 4, and performing a process of decoding Reed Solomon code.

The output of the internal code decoder 10 on the basis of SOVA is inputted to the CRC decoder 2. One of the outputs of the CRC decoder 2 is inputted to the de-interleaver 3, and the other output of the CRC decoder 2 is inputted to the erasure position detector 4. The output of the de-interleaver 3 is inputted to the erasure position detector 4, and the output of the erasure position detector 4 is inputted to the external code decoder 5.

Next, the operation in this embodiment will be described with reference to FIGS. 2 and 3. In the following description, it is assumed that the interleave length is 5 frames, and interframe interleave is performed for every 5 frames. In addition, a Reed Solomon code is used as an external code. As a format of the code, a compacted code RS (40, 32, 4) based on an original RS (255, 247, 4) code defined on Galois field GF ($2^8$) is used, and 8-symbol erasure correction and 4-symbol error correction are performed separately in the external code decoder 5. Switching between the 8-symbol erasure correction and the 4-symbol error correction is decided by the erasure position detector 4, thereby controlling the external code decoder 5. In addition, at the time of the 8-symbols erasure correction, the erasure positions of 8 symbols are also inputted to the external code decoder 5. In this embodiment, one symbol in the Reed Solomon code is constituted by 8 bits.

In the CRC decoder 2, frame error detection is performed on the basis of CRC judgement. In the case of interframe interleave for every 5 frames, when a frame error is detected in one frame of five frames, it is understood that one symbol is erased for every 5 symbols in 40 symbols of received words inputted in the decoding process of the Reed Solomon code. However, in fact, one symbol is not always erased for every 5 symbols, but at least one symbol is erased. Therefore, when a frame error is detected by CRC judgement by the CRC decoder 2 in one frame of 5 frames in which interframe de-interleave will be performed, the detected information is inputted to the erasure position detector 4. The erasure position detector 4 determines that 8 symbols have been erased in the 40 symbols, controls the external code decoder 5 so as to correct the erasure of the 8 symbols, and further inputs the erasure positions of the 8 symbols to the external code decoder 5. The external code decoder 5 corrects the erasure of the 8 symbols.

On the other hand, when no frame error is detected by the CRC judgement of the CRC decoder 2, the erasure position detector 4 receives the information, and controls the external code decoder 5 so as to perform 4-symbol error correction in order to prevent residual errors. Alternatively, when a frame error of two or more frames is detected by the CRC judgement of the CRC decoder 2, 16 or more candidates are regarded as erasure positions, as shown in FIG. 3. At this time, the erasure position detector 4 cannot limit the erasure positions to 8 positions, and therefore decides the erasure positions also by means of both the CRC judgement result and the reliability of output data. That is, as shown in FIG. 3, 8 positions of the candidates of erasure positions based on the CRC judgement result are searched in ascending order of the reliability of decoded data obtained by the internal code decoder 10 on the basis of SOVA, and 8-symbol erasure correction is performed by being regarded the searched positions as the erasure positions.

Figure 7:
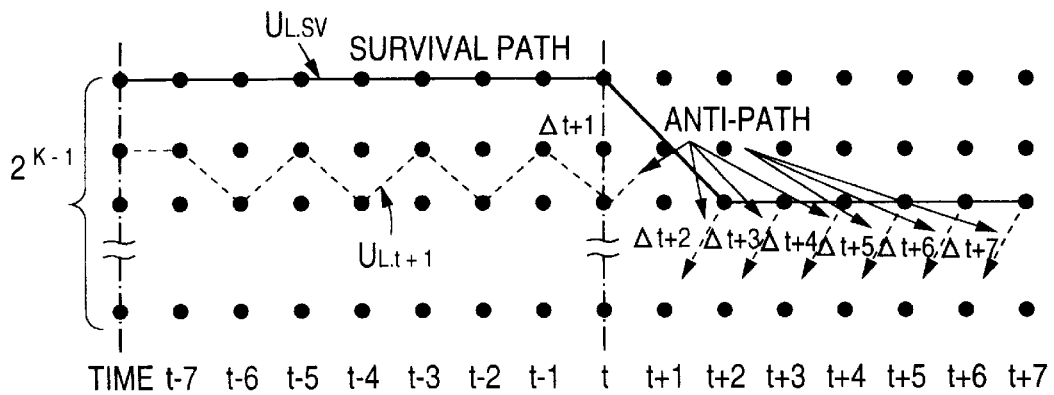
FIG. 7 is a trellis diagram showing the operation of SOVA in Embodiment 4 according to the present invention.
Figure 8:
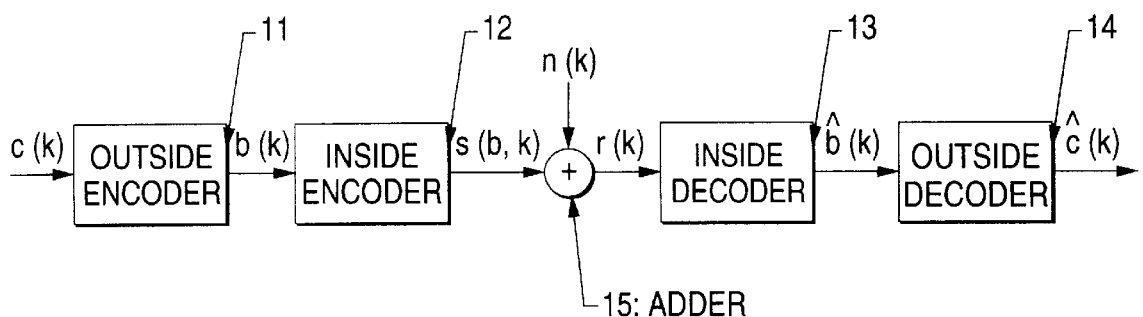
FIG. 8 is a block diagram of an error correction device using a concatenated code in a conventional example.
Figure 9:
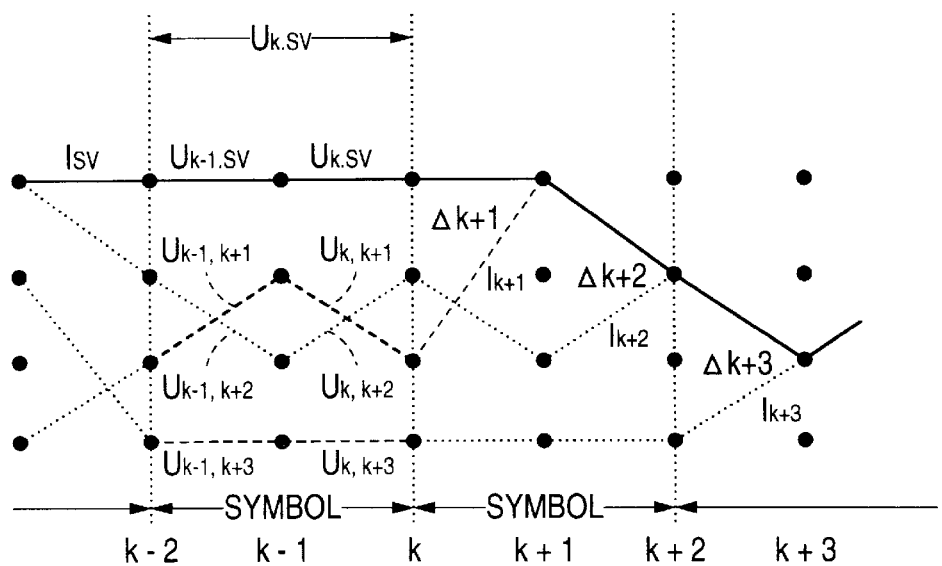
FIG. 9 is a trellis diagram at the time of K=3 in the conventional example.

The internal code decoder 10 based on SOVA will be described here with reference to FIG. 7. The contents of SOVA processing can be roughly divided as follows.

(1) Branch metric calculation
(2) ACS arithmetic operation
(3) Trace back
(4) Reliability calculation Almost the same operation as the conventional soft judgement Viterbi decoding is performed in (1) to (3). However, there is a difference in the (2) ACS arithmetic operation that not only survival paths but all the path metric are stored. In the reliability calculation, the reliability of symbols (8 bits) Ut and sv constituted by decoded bits from time t−7 to time t on a survival path as shown in the trellis line diagram of FIG. 7 is calculated in the following procedure.

I. Paths against the survival path (hereinafter referred to as "anti-path" from time t+1 to time t+7 are introduced.

II. Judgment is made as to whether a series of decoded bits Ut, t+1, Ut, t+2, ... , Ut, t+7 corresponding to one symbol from time t−7 to time t on each anti-path are equal to the symbols Ut and sv on the survival path or not.

III. A path metric difference is calculated between each anti-path judged as being not equal to the symbols Ut and sv in II, and the survival path calculated.

IV. The minimum value is detected among the obtained at most seven reliability $\Delta t+1, \Delta t+2, \ldots, \Delta t+7$, and the value is set as the reliability Lt of the symbols Ut and sv.

By repeating the above procedure, the reliability of each symbol constituted by 8 bits of a Reed Solomon code is calculated by 8 bits, and the decoded data of 8 bits and the reliability of 8 bits are outputted alternately.

In the CRC decoder 2, of the inputted decoded data and the inputted reliability of the decoded data, only the decoded data is subjected to CRC judgement process. The output data and the reliability of the output data inputted to the de-interleaver 3 are temporarily stored in a buffer. In the buffer, the decoded data are stored in the upper 8 bits of one word (16 bits), and the reliability is stored in the lower 8 bits. The de-interleaver 3 performs a de-interleave process by word. With the above-mentioned configuration and operation, it is possible to perform an error correction process with a much higher accuracy.

As has been described, according to the present invention, the error correction device is provided with an internal code decoder which outputs a series of decoded data and reliability information of the decoded data, a CRC (Cyclic Redundancy Check) decoder for performing CRC judgement, a de-interleaver for performing de-interleave, a erasure position detector for performing a erasure position detecting process, and an external code decoder for decoding an external code by soft judgement. By switching an error correction mode with a high accuracy, such an advantageous effect can be obtained that it is possible to realize error correction efficiently, so that it is possible to improve the capability of error correction, and it is possible to obtain low BER characteristics.

Description of Reference Numerals 1, 6, 8 internal code decoder
2 CRC decoder
3 de-interleaver
4 erasure position detector
5 external code decoder
7 electric field intensity meter
9 SIR meter
10 internal code decoder based on SOVA
11 outside encoder
12 inside encoder
13 inside decoder
14 outside decoder
15 adder

What is claimed is:

1. An error correction device comprising:
an internal code decoder for receiving reception data, and performing a decoding process of an internal code and calculation of reliability thereof;
a CRC (Cyclic Redundancy Check) decoder for receiving an output of said internal code decoder, and performing a CRC process;
a de-interleaver for receiving an output of said CRC decoder, and performing de-interleave;
an erasure position detector for receiving the output of said CRC decoder and an output of said de-interleaver, and performing an erasure position detecting process; and
an external code decoder for receiving an output of said erasure position detector, and decoding an external code by soft judgement.

2. The error correction device of claim 1,
wherein SOVA (Soft Output Viterbi Algorithm) is applied to decoding algorithm of said internal code, and a Reed Solomon code is used as said external code.

3. An error correction device comprising:
an internal code decoder for receiving reception data, and performing a decoding process of an internal code and calculation of reliability thereof;
a CRC (Cyclic Redundancy Check) decoder for receiving an output of said internal code decoder, and performing a CRC process;
a de-interleaver for receiving an output of said CRC decoder, and performing de-interleave;
an erasure position detector for receiving the output of said CRC decoder and an output of said de-interleaver, and performing an erasure position detecting process;
an external code decoder for receiving an output of said erasure position detector, and decoding an external code by soft judgement; and,
an electric field intensity meter for measuring electric field intensity of said reception data and inputting the measured electric field intensity to said internal code decoder when said internal code is to be decoded,
wherein a Reed Solomon code is used as said external code.

4. An error correction device comprising:
an internal code decoder for receiving reception data, and performing a decoding process of an internal code and calculation of reliability thereof;
a CRC (Cyclic Redundancy Check) decoder for receiving an output of said internal code decoder, and performing a CRC process;
a de-interleaver for receiving an output of said CRC decoder, and performing de-interleave;
an erasure position detector for receiving the output of said CRC decoder and an output of said de-interleaver, and performing an erasure position detecting process;
an external code decoder for receiving an output of said erasure position detector, and decoding an external code by soft judgement; and
an SIR meter for measuring SIR (Signal Interface Ratio) and inputting the measured SIR to said internal code decoder when said internal code is to be decoded,
wherein a Reed Solomon code is used as said external code.

* * * * *